United States Patent
Mao et al.

(10) Patent No.: US 10,600,700 B2
(45) Date of Patent: Mar. 24, 2020

(54) TEST STRUCTURE AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventors: YiPing Mao, Shanghai (CN); GuangNing Li, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 15/995,301

(22) Filed: Jun. 1, 2018

(65) Prior Publication Data

US 2019/0074232 A1    Mar. 7, 2019

(30) Foreign Application Priority Data

Sep. 1, 2017 (CN) .......................... 2017 1 0778403

(51) Int. Cl.
*H01L 21/66* (2006.01)
*B81C 1/00* (2006.01)
(Continued)

(52) U.S. Cl.
CPC ............ *H01L 22/34* (2013.01); *B81B 7/0077* (2013.01); *B81B 7/02* (2013.01); *B81C 1/00269* (2013.01); *B81C 1/00333* (2013.01); *B81C 3/001* (2013.01); *G01R 31/26* (2013.01); *G01R 31/2829* (2013.01); *G01R 31/2831* (2013.01); *H01L 24/64* (2013.01); *B81B 2201/0292* (2013.01); *G01R 31/2812* (2013.01); *G01R 31/2844* (2013.01); *H01L 24/89* (2013.01)

(58) Field of Classification Search
None
See application file for complete search history.

(56) References Cited

U.S. PATENT DOCUMENTS 7,569,926 B2 *  8/2009  Carlson ............... B81C 1/00269
                                                257/704
7,939,938 B2 *  5/2011  Hata ................... B81C 1/00269
                                                257/685

(Continued)

*Primary Examiner* — Andres Munoz
(74) *Attorney, Agent, or Firm* — Brinks Gilson & Lione

(57) ABSTRACT

This application relates to the field of semiconductor technologies, and discloses a test structure and a manufacturing method therefor. Forms of the method may include: providing a top wafer structure, where the top wafer structure includes a top wafer and multiple first pads that are spaced from each other at a bottom of the top wafer; providing a bottom wafer structure, where the bottom wafer structure includes a bottom wafer and multiple second pads that are spaced from each other at a top of the bottom wafer, where a side surface of at least one of two adjacent second pads has an insulation layer; bonding the multiple first pads with the multiple second pads in a eutectic bonding manner, where each first pad is bonded with a second pad, to form multiple pads. This application may mitigate a problem that bonded pads are connected to each other.

10 Claims, 6 Drawing Sheets

(51) Int. Cl.
    *G01R 31/28*   (2006.01)
    *B81B 7/00*    (2006.01)
    *H01L 23/00*   (2006.01)
    *B81C 3/00*    (2006.01)
    *B81B 7/02*    (2006.01)
    *G01R 31/26*   (2020.01)

(56) References Cited

U.S. PATENT DOCUMENTS

2008/0067652 A1* 3/2008 Menard ............... B81C 1/00269
                                                    257/678
2011/0133294 A1* 6/2011 Park .................... B81C 3/001
                                                    257/415
2012/0068325 A1* 3/2012 Montez ............... B81C 1/00269
                                                    257/684

* cited by examiner

| | 1.8 | 1.8 | 1.8 | 1.8 | 1.8 | |
|---|---|---|---|---|---|---|
| 1.8 | 1.8 | 1.8 | 1.8 | 1.8 | 1.8 | 1.8 |
| 1.8 | 1.8 | 4.06 | 4.07 | 4.06 | 4.08 | 1.8 |
| 1.8 | 1.8 | 1.8 | 4.05 | 1.8 | 4.06 | 1.8 |
| | 1.8 | 1.8 | 4.05 | 4.07 | 1.8 | |

| | 4.09 | 4.06 | 4.06 | 4.07 | 4.06 | |
|---|---|---|---|---|---|---|
| 4.08 | 4.06 | 4.05 | 4.05 | 4.06 | 4.06 | 4.05 |
| 4.08 | 4.07 | 4.06 | 4.07 | 4.06 | 4.08 | 4.09 |
| 4.07 | 4.05 | 4.07 | 4.05 | 4.08 | 4.06 | 4.05 |
| | 4.07 | 4.08 | 4.05 | 4.07 | 4.09 | |

TEST STRUCTURE AND MANUFACTURING METHOD THEREFOR

RELATED APPLICATIONS

The present application claims priority to Chinese Patent Appln. No. 201710778403.2, filed Sep. 1, 2017, the entire disclosure of which is hereby incorporated by reference.

BACKGROUND

Technical Field

The present application relates to the field of semiconductor technologies, and in particular, to a test structure and a manufacturing method therefor.

Related Art

A wafer acceptance test (WAT test) is an electrical test that is performed on various test structures of a wafer after all processes of the wafer are completed.

An MEMS sensor, such as a micro-electro-mechanical systems (MEMS) inertial sensor, has a process for eutectic bonding of two wafers. In scribe lanes of a top wafer and a bottom wafer, there are test structures. A bonded test structure is formed after eutectic bonding is performed on the top wafer and the bottom wafer, and then a WAT test may be performed on the bonded test structure.

However, the inventor of this application finds that the WAT test often fails when the WAT test is performed on the bonded test structure.

SUMMARY

An objective of this application is to provide test structures and manufacturing methods therefor, to mitigate a problem that bonded pads are connected to each other, thereby mitigating a problem of WAT test failure.

In one aspect of this application, a test structure manufacturing method is provided. The test structure manufacturing method may include: providing a top wafer structure, where the top wafer structure includes a top wafer and multiple first pads that are spaced from each other at a bottom of the top wafer; providing a bottom wafer structure, where the bottom wafer structure includes a bottom wafer and multiple second pads that are spaced from each other at a top of the bottom wafer, where a side surface of at least one of two adjacent second pads has an insulation layer; bonding the multiple first pads with the multiple second pads in a eutectic bonding manner, where each first pad is bonded with a second pad, to form multiple pads.

In some implementations, the second pad whose side surface has the insulation layer has a trench.

In some implementations, a side wall of the trench has an insulation layer.

In some implementations, a bottom of the trench is higher than the top of the bottom wafer.

In some implementations, a side surface of each second pad has an insulation layer; and the step of providing a bottom wafer structure includes: providing the bottom wafer; forming a pad material layer on the bottom wafer; patterning the pad material layer, to form multiple initial second pads in a pad region; forming the insulation layer on a side surface of the initial second pad; and etching the initial second pad to form the trench, to form the second pad.

In some implementations, a side surface of each second pad has an insulation layer; and the providing a bottom wafer structure includes: providing the bottom wafer; forming a pad material layer on the bottom wafer; patterning the pad material layer, to form the second pad having the trench; and forming the insulation layers on the side wall of the second pad and on the side wall of the trench.

In some implementations, an area of the first pad accounting for the top wafer is less than an area of the second pad accounting for the bottom wafer.

In some implementations, the trench includes multiple trenches whose extension directions are substantially parallel.

In some implementations, a material of the insulation layer includes one or more of the followings: a silicon oxide, a silicon nitride, or a silicon oxynitride.

In some implementations, the pad includes two metal elements; or the pad includes a metal element and a semiconductor element.

In some implementations, a micro-electro-mechanical systems sensor is formed in one of the top wafer or the bottom wafer.

In another aspect of the present application, a test structure is provided. The test structure may include: a top wafer; a bottom wafer, located under the top wafer; and multiple pads, configured to connect to the top wafer and the bottom wafer, where a side surface of at least one of two adjacent pads has an insulation layer.

In some implementations, separated insulation layers are embedded in the pad whose side surface has the insulation layer.

In some implementations, a bottom of the insulation layers embedded in the pad is higher than a top of the bottom wafer.

In some implementations, a material of the insulation layer includes one or more of the followings: a silicon oxide, a silicon nitride, or a silicon oxynitride.

In some implementations, the pad includes two metal elements; or the pad includes a metal element and a semiconductor element.

In some implementations, a micro-electro-mechanical systems sensor is formed in one of the top wafer or the bottom wafer.

In implementations of the present application, because an insulation layer is formed on a side surface of at least one of adjacent second pads, adjacent pads in multiple pads that are formed after bonding may be prevented from being connected together, thereby mitigating the problem of WAT test failure.

Based on the detailed description of exemplary embodiments and implementations of the present application below, with reference to the following accompanying drawings, other characteristics, aspects, and other advantages of the present application will be clearer.

BRIEF DESCRIPTION OF THE DRAWINGS

The accompanying drawings constitute a part of this specification describing exemplary embodiments and implementations of the present application, and are used, together with this specification, to explain the principles and concepts of the present application. In the accompanying drawings.

DETAILED DESCRIPTION

Various exemplary embodiments and implementations of the present application are described in detail with reference to the accompanying drawings. It should be understood that, unless otherwise specified, relative layout of the parts and the steps that are described in the embodiments, numerical expressions, and values should not be construed as limiting the scope of this application.

In addition, it should be understood that, for ease of description, sizes of the parts shown in the accompanying drawings are not necessarily drawn according to actual ratios. For example, thicknesses or widths of some layers may be exaggerated relative to other layers.

The following descriptions of exemplary embodiments and implementations are merely illustrative, and do not limit this application and application or use of this application.

Technologies, methods, and apparatuses that are known by a person of ordinary skill in the art may not be discussed in detail, but the technologies, methods, and apparatuses shall be considered as a part of this specification when appropriate.

It should be noted that, similar reference signs and letters in the following accompanying drawings represent similar items. Therefore, once one item is defined or illustrated in one accompanying drawing, the item does not need to be further discussed in subsequent accompanying drawings.

Figure 1:
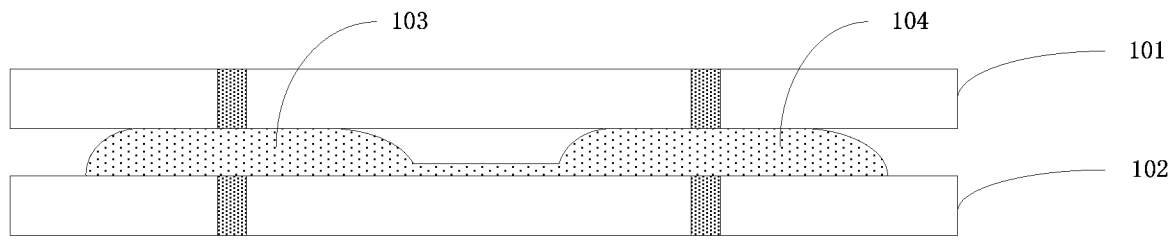
FIG. 1 is a schematic diagram of an existing test structure.

The inventor has performed extensive research on a problem of WAT test failure, and finds that, after a top wafer 101 and a bottom wafer 102 is bonded, two adjacent pads 103 and 104 can connect to each other, that is, form a bridge, as shown in FIG. 1. The adjacent pads form the bridge, resulting in a short circuit of a test structure, further resulting in failure of the WAT test. Accordingly, the inventor puts forward the following solutions.

Figure 2:
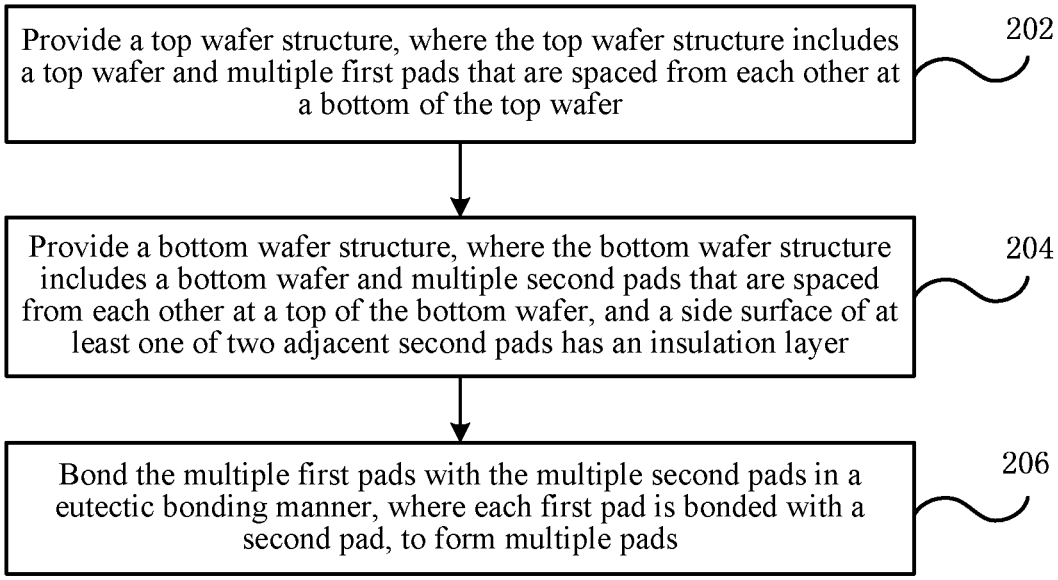
FIG. 2 is a schematic flowchart of one form of a test structure manufacturing method.
Figure 3:
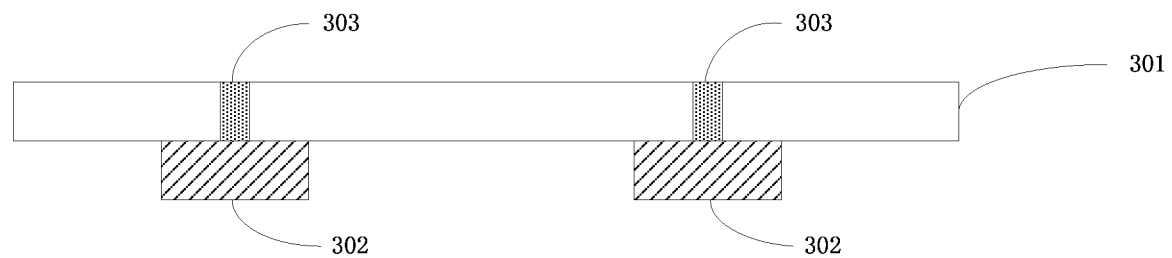
FIG. 3 is a schematic diagram of a top wafer structure.
Figure 4:
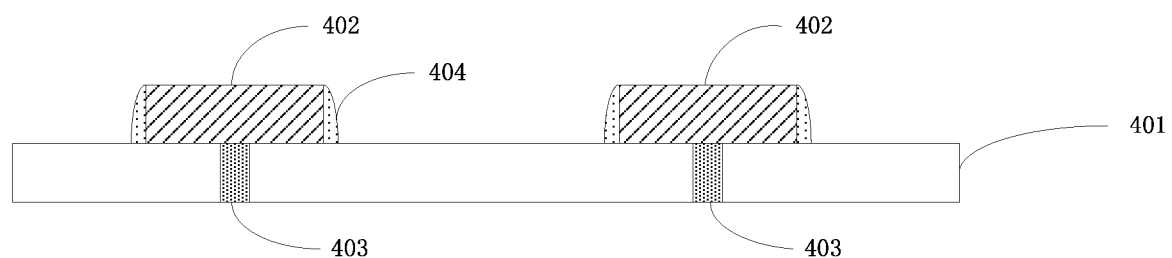
FIG. 4 is a schematic diagram of a bottom wafer structure.
Figure 5:
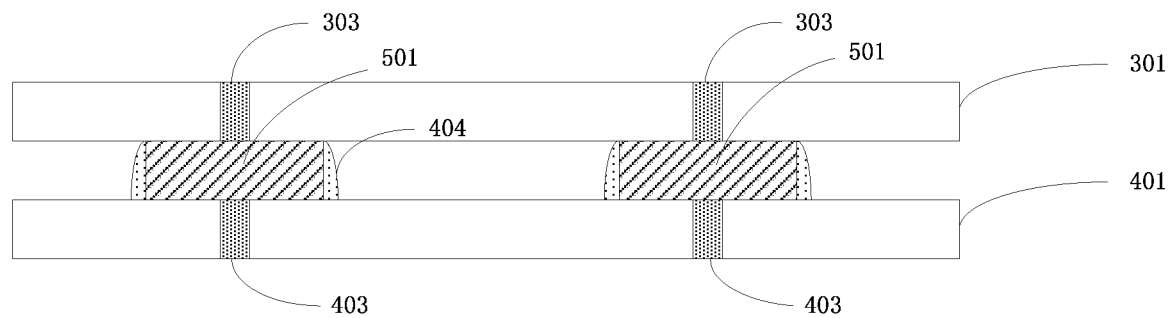
FIG. 5 is a schematic diagram of one form of a test structure.

FIG. 2 is a schematic flowchart of one form of a test structure manufacturing method. FIG. 3 to FIG. 5 are schematic diagrams of stages of a test structure manufacturing method.

The following provides a detailed description of one form of a test structure manufacturing method with reference to FIG. 2 and FIG. 3 to FIG. 5.

As shown in FIG. 2, in step 202, a top wafer structure is provided.

FIG. 3 is a schematic diagram of one implementation of a top wafer structure. As shown in FIG. 3, the top wafer structure includes a top wafer 301 and multiple first pads 302 (two first pads are schematically shown in FIG. 3) that are spaced from each other at a bottom of the top wafer 301. Each first pad 302 may be in contact with a connective kit 303 of the top wafer 301. A material of the first pad 302 may be a semiconductor, such as germanium; or may be a metal, such as tin, aluminum, or copper.

It should be understood that, the connective kit 303 shown in FIG. 3 is merely schematic. In fact, the top wafer 301 may include different metal layers, and the different metal layers may be connected using a corresponding connective kit 303 (for example, a metal connective kit). In addition, a logic circuit, for example, a logic circuit including components such as an MOS component, may be formed in the top wafer 301.

In step 204, a bottom wafer structure is provided.

FIG. 4 is a schematic diagram of one implementation of a bottom wafer structure. As shown in FIG. 4, the bottom wafer structure includes a bottom wafer 401 and multiple second pads 402 that are spaced from each other at a top of the bottom wafer 401. Each second pad 402 may be in contact with a connective kit 403 in the bottom wafer 401. A side surface of at least one of two adjacent second pads 402 has an insulation layer 404. A material of the insulation layer 404 may include one or more of the followings: a silicon oxide (for example, $SiO_2$), a silicon nitride (for example, SiN), or a silicon oxynitride (for example, SiON). A material of the second pad 402 may be a semiconductor, such as germanium; or may be a metal, such as tin, aluminum, or copper.

In a case, side surfaces of both two adjacent second pads 402 may have insulation layers 404, as shown in FIG. 4. In another case, a side surface of one of two adjacent second pads 402 has an insulation layer 404, but a side surface of the other second pad 402 may have no insulation layer 404.

In some implementations, an MEMS sensor, such as an MEMS inertial sensor, may be formed in the bottom wafer 401. In other implementations, an MEMS sensor may be formed in the top wafer 301.

In step 206, the multiple first pads 302 are bonded with the multiple second pads 402 in a eutectic bonding manner, to form multiple pads 501, to form a test structure shown in FIG. 5. Then, a WAT test is performed on the test structure.

During the bonding, each first pad 302 is bonded with a corresponding second pad 402, and the two pads form a pad 501 after the bonding. Preferably, the bonded pad 501 is an alloy pad. In some implementations, the pad 501 includes two metal elements. In other implementations, the pad 501 includes a metal element and a semiconductor element. In some implementations, a resistance of the bonded pad is less than that of the first pad 302 before the bonding, and is less than that of the second pad 402.

In the foregoing embodiments and implementations, because an insulation layer 404 is formed on a side surface of at least one of adjacent second pads 402, adjacent pads in the multiple pads 501 that are formed after the bonding may be prevented from being connected together.

In some implementations, an area of the first pad 302 accounting for the top wafer 301 is less than an area of the second pad 402 accounting for the bottom wafer 401, to make a bonding reaction occur as much as possible in a region in which the second pad 402 is located, and to prevent a pad material from overflowing from the top wafer 301 during the bonding, so as to better prevent the pads 501 that are formed after the bonding from being connected together.

The inventor finds that, the insulation layer 404 is formed, but the pad material may still overflow during the bonding, consequently, adjacent bonded pads 501 may still be connected together. Accordingly, the inventor also puts forward the following two improvement solutions.

Figure 6A:
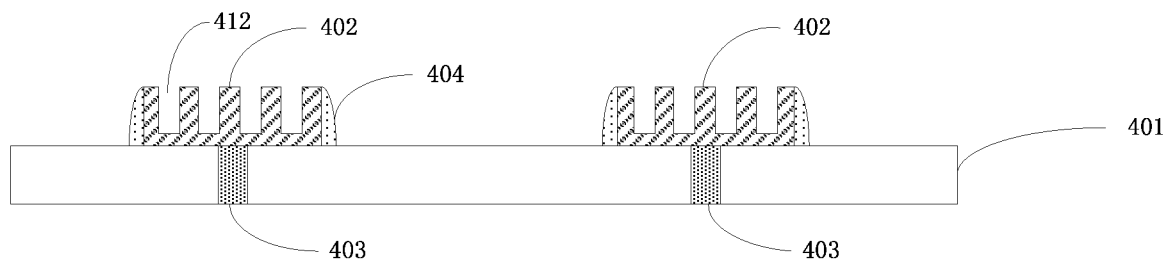
FIG. 6A is a schematic diagram of another implementation of a bottom wafer structure.

FIG. 6A is a schematic diagram of another form of a bottom wafer structure. Compared with the bottom wafer structure shown in FIG. 4, a trench 412 (may also be referred to as a hollow) may be formed in a second pad 402 of the bottom wafer structure shown in FIG. 6A. In some implementations, the trench 412 may include multiple trenches whose extension directions are basically parallel. In other implementations, the trench 412 may include first trenches extending along a first direction and multiple second trenches extending along a second direction, and the first trenches and the second trenches may intersect. Forming of the trench 412 may provide space for the bonding process, thereby preventing a pad material from overflowing, so as to better prevent pads that are formed after bonding from being connected together.

It should be understood that, this application is not limited to the foregoing specific arrangement of the trench 412, provided that the second pad 402 has the trench 412 providing space for the bonding process.

In some implementations, the trench 412 may extend to a top of a bottom wafer 401, that is, the trench threads through the second pad 402. Alternatively, the trench may stop in the second pad 402, so that a bottom of the trench 412 is higher than the top of the bottom wafer 401, as shown in FIG. 6A. In some implementations, the bottom of the trench 412 is higher than the top of the bottom wafer 401, so that a connective kit 403 under the second pad 402 is prevented from being damaged when the trench 412 is formed.

Figure 6B:
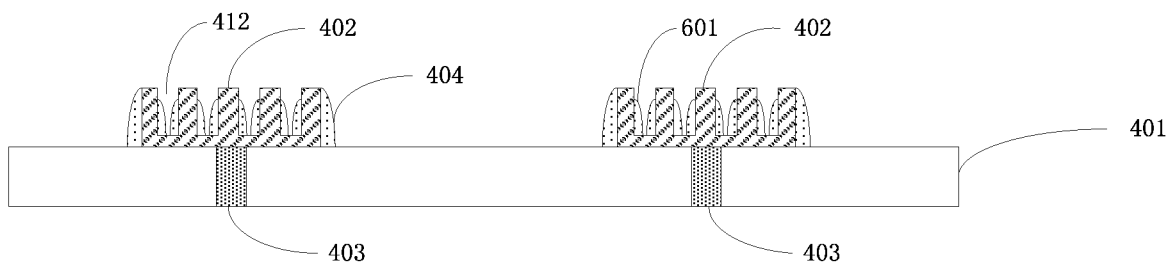
FIG. 6B is a schematic diagram of another implementation of a bottom wafer structure.

FIG. 6B is a schematic diagram of yet another form of a bottom wafer structure. Compared with the bottom wafer structure shown in FIG. 6A, in the bottom wafer structure shown in FIG. 6B, a side wall of the trench 412 has an insulation layer 601. In some implementations, the insulation layer 601 may be formed only on a lower portion of the side wall of the trench 412. That is, the insulation layer 601 may not be on an upper portion of the side wall of the trench 412. The second pad 402 having the trench 412 may be regarded as including multiple strip (which may also be another shape, and the strip is used as an example herein) pads, and adjacent strip pads are separated by the trench 412. In a bonding process, because a top wafer and a bottom wafer may extrude each other, the strip pads may tilt, affecting contact between upper first pads and lower second pads, affecting a bonding effect. However, when the side wall of the trench 412 has the insulation layer 601, the insulation layer 601 has a support function, to prevent the strip pads from tilting, and improve the bonding effect.

Figure 6C:
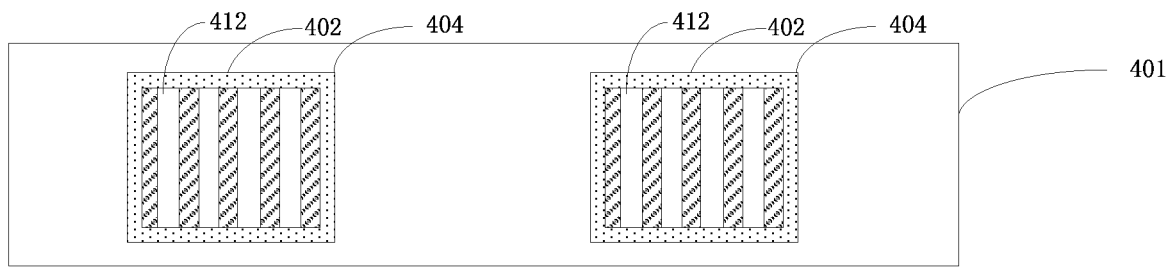
FIG. 6C is a schematic top view of a second pad having a trench.

FIG. 6C is a schematic top view of a second pad 401 having a trench 412. Herein, for brevity, only the trench 412 is shown, but an insulation layer 601 on a side wall of the trench 412 is not shown.

The following describes a forming manner of the bottom wafer structure shown in FIG. 6A according to FIG. 7A to FIG. 7E.

Figure 7A:
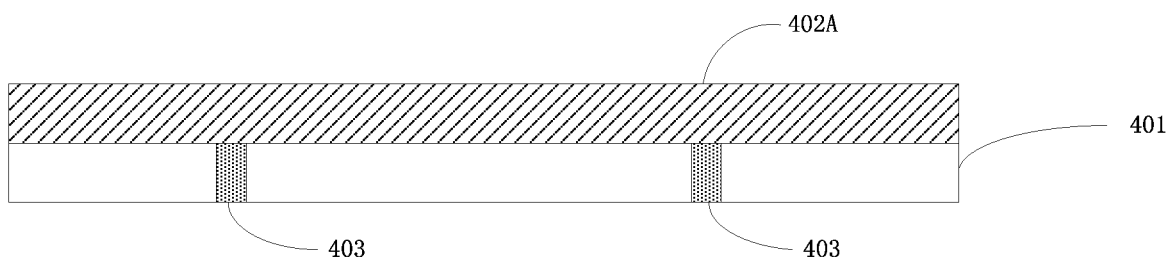
FIG. 7A to FIG. 7E are schematic diagrams of stages of forming the bottom wafer shown in FIG. 6A.

First, a bottom wafer 401 is provided, and a pad material layer 402A is formed on the bottom wafer 401, as shown in FIG. 7A. An MEMS sensor, a connective kit 403, and the like may be formed in the bottom wafer 401.

Figure 7B:
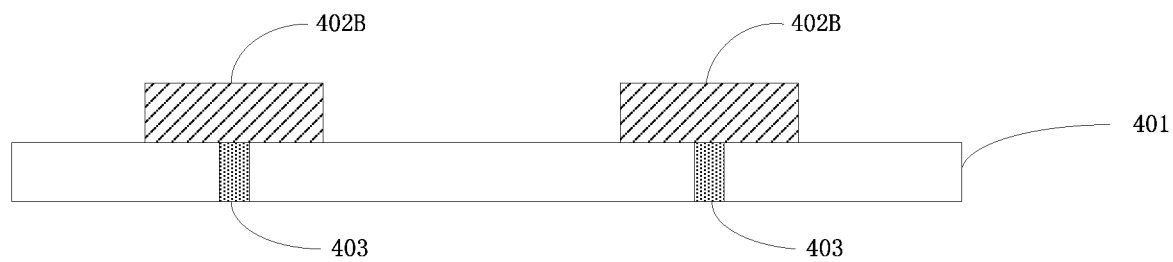

Then, the pad material layer 402A is patterned, to form multiple initial second pads 402B (that is, second pads in the prior art) in a pad region (that is, a region covering the connective kit 403), as shown in FIG. 7B. For example, the pad material layer 402A may be patterned using photoetching and etching process.

Next, insulation layers 404 are formed on side surfaces of the initial second pads 402B.

Figure 7C:
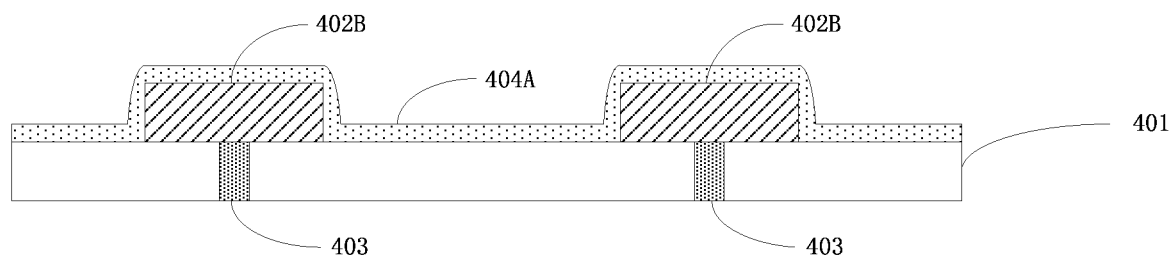
Figure 7D:
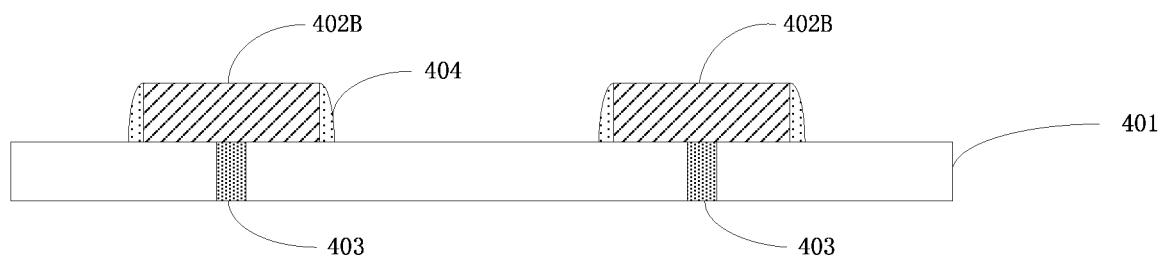

In an implementation, as shown in FIG. 7C, an insulation material layer 404A is deposited, and the insulation material layer 404A covers a surface of the bottom wafer 401 and surfaces and the side surfaces of the initial second pads 402B. Then, as shown in FIG. 7D, the insulation material layer 404A on the surface of the bottom wafer 401 and on the surfaces of the initial second pads 402B is removed by means of anisotropic etching, and the remaining insulation material 404A on the side surfaces of the initial second pads 402B are used as the insulation layers 404.

Figure 7E:
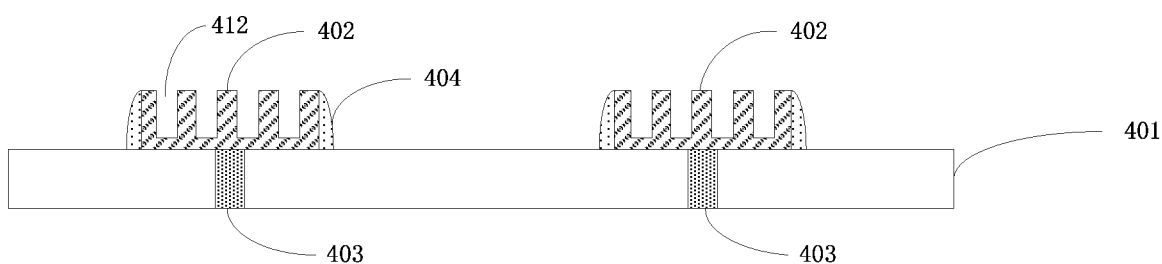

Then, the initial second pads 402B are etched, to form trenches 412, so as to form second pads 402, as shown in FIG. 7E. For example, a patterned mask layer, for example, a photoresist, is formed on the initial second pads 402B, to define a shape of the trenches; then, the initial second pads 402B are etched by using the mask layer as a mask, to form the trenches 412.

The bottom wafer structure shown in FIG. 6A may be formed using the foregoing process, then the top wafer structure shown in FIG. 3 may be bonded with the bottom wafer structure shown in FIG. 6A, to form a test structure similar to that in FIG. 5.

The following describes a manner for forming the bottom wafer structure shown in FIG. 6B according to FIG. 8A to FIG. 8D.

Figure 8A:
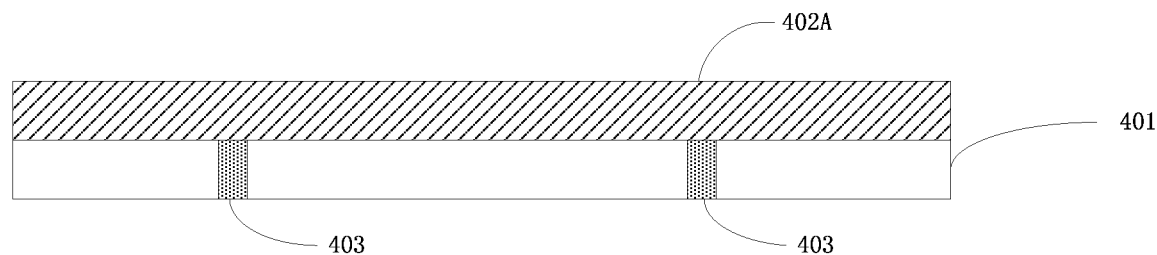
FIG. 8A to FIG. 8D are schematic diagrams of stages of forming the bottom wafer shown in FIG. 6B.

First, a bottom wafer 401 is provided, and a pad material layer 402A is formed on the bottom wafer 401, as shown in FIG. 8A.

Figure 8B:
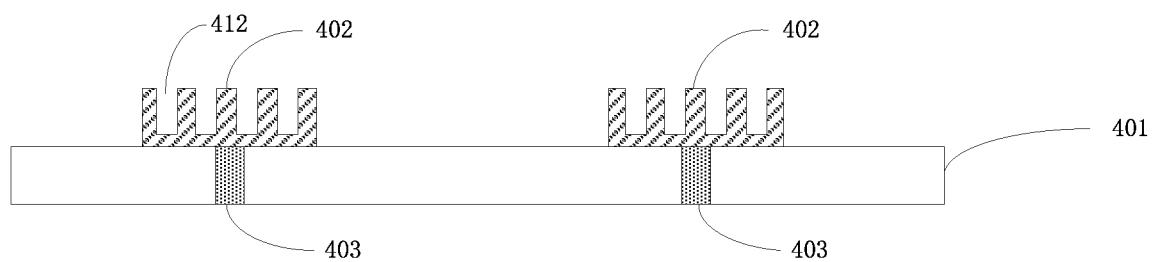

Then, the pad material layer 402A is patterned, to form second pads 402 having trenches 412, as shown in FIG. 8B. If a bottom of the trenches 412 is higher than a top of the bottom wafer 402, the initial second pads 402B shown in FIG. 7B may be first formed in a similar manner, and then the initial second pads 402B are etched, to form the trenches 412. If the bottom of the trenches 412 is the top of the bottom wafer 402, the second pads having the trenches 412 may be formed by performing photoetching once.

Then, insulation layers 404 are formed on side surfaces of the second pads 402 and on side walls of the trenches 412.

Figure 8C:
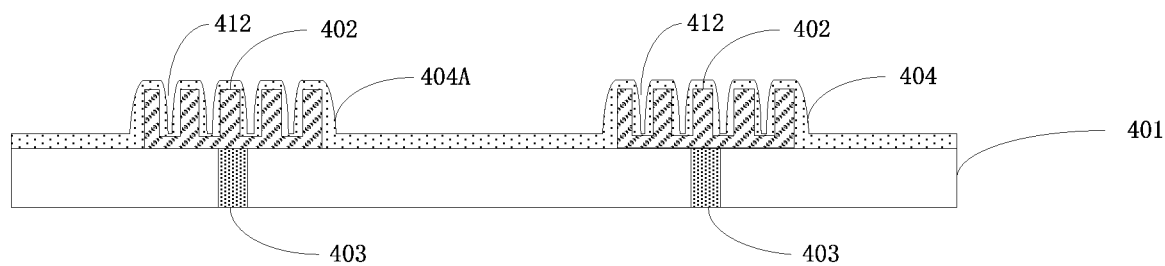
Figure 8D:
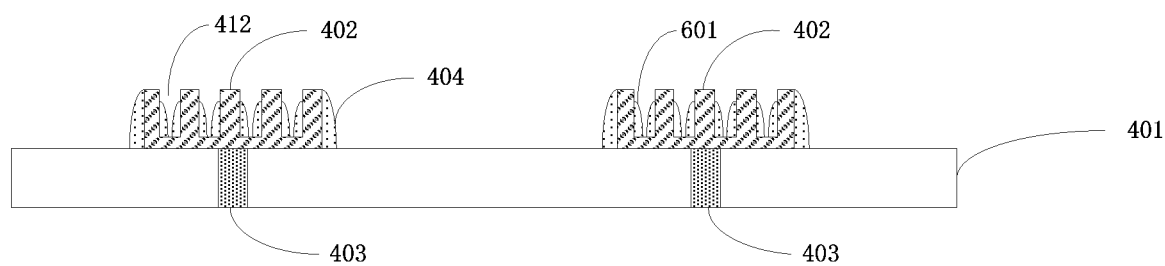

In an implementation, as shown in FIG. 8C, an insulation material layer 404A is deposited on the structure shown in FIG. 8B, and the insulation material layer 404A covers a surface of the bottom wafer 401, surfaces and the side surfaces of the second pads 402, and the bottom and the side walls of the trenches 412. Then, as shown in FIG. 8D, the insulation material layer 404A on the surface of the bottom wafer 401 and on the surfaces of the second pads 402B is removed by means of anisotropic etching, the remaining insulation material 404A on the side surfaces of the second pads 402B are used as the insulation layers 404, and the remaining insulation material layer 404A on the side walls of the trenches 412 are used as insulation layers 601. It should be noted that, in an anisotropic etching process, the insulation material layer 404A on upper portions of the side walls of the trenches 412 may be removed, so that only the insulation material layer 404A on lower portions of the side walls of the trenches 412 are reserved. It should be understood that, the "upper portions" and the "lower portions" described herein are only opposite concepts, and have no fixed demarcation line.

Figures 9, 10A, 10B:
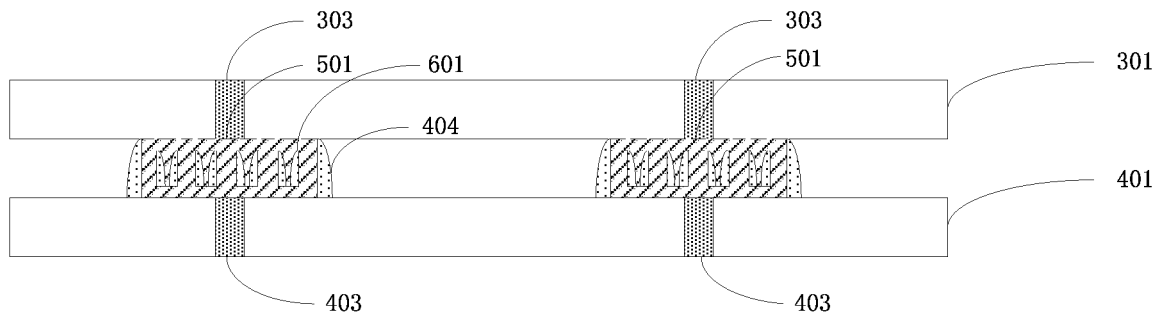
FIG. 9 is a schematic diagram of another form of a test structure.
FIG. 10A shows an example of a test result of an existing test structure.
FIG. 10B shows an example of a test result of a test structure according to forms of the present application.

The bottom wafer structure shown in FIG. 6B may be formed using the foregoing process, then the top wafer structure shown in FIG. 3 may be bonded with the bottom wafer structure shown in FIG. 6B, to form a test structure shown in FIG. 9.

FIG. 10A shows an example of a test result of an existing test structure. FIG. 10B shows an example of a test result of a test structure according to implementations of the present application. FIG. 10A and FIG. 10B show breakdown voltages between a source and a drain of an N-type transistor. It can be seen from FIG. 10A that, because adjacent pads after bonding are connected to each other, resulting in short circuit of the test structure, most of test results deviate from a normal breakdown voltage. However, it can be seen from FIG. 10B that, test results slightly float, and the test results are valid.

Based on the manufacturing methods in the foregoing different embodiments and implementations, this application also provides different test structures.

In one implementation, referring to FIG. 5, a test structure includes a top wafer 301, a bottom wafer 401 located under the top wafer 301, and multiple pads 501. The multiple pads 501 are configured to connect to the top wafer 301 and the bottom wafer 401. A side surface of at least one of two adjacent pads 501 has an insulation layer 404. In some implementations, the pad 501 is an alloy pad. For example, the pad 501 may include two metal elements. For another example, the pad 501 may include a metal element and a semiconductor element.

In some implementations, referring to FIG. 9, separated insulation layers 601 are embedded in a pad 501 whose side surface has an insulation layer 404. Preferably, a bottom of the insulation layers 601 embedded in the pad 501 is higher than a top of a bottom wafer 401.

Above, test structures and manufacturing methods therefor according to this application have been described in detail. To avoid obstructing the concepts of the present application, some details known in the art are not described. A person skilled in the art will fully understand, according to the foregoing descriptions, how to implement the technical solutions disclosed herein. In addition, the embodiments and implementations disclosed herein may be freely combined. A person skilled in the art will understand that modifications may be made to the foregoing embodiments and implementations without departing from the scope and the spirit of this application that are limited by the appended claims.

What is claimed is:

1. A test structure manufacturing method, comprising:
   providing a top wafer structure, wherein the top wafer structure comprises a top wafer and multiple first pads that are spaced from each other at a bottom of the top wafer;
   providing a bottom wafer;
   forming a pad material layer on the bottom wafer;
   patterning the pad material layer, to form multiple initial second pads in a pad region;
   forming an insulation layer on a side surface of each initial second pad;
   etching the multiple initial second pads to form trenches, to form multiple second pads that are spaced from each other at a top of the bottom wafer; and
   bonding, in an eutectic manner, the multiple first pads with the multiple second pads, wherein each first pad is bonded with a second pad, to form multiple pads.

2. The method according to claim 1, wherein one of the second pads whose side surface has the insulation layer has a trench.

3. The method according to claim 2, wherein a side wall of the trench has a second insulation layer.

4. The method according to claim 2, wherein a bottom of the trench is higher than the top of the bottom wafer.

5. The method according to claim 2, wherein the trench comprises multiple second trenches whose extension directions are substantially parallel.

6. The method according to claim 1, wherein an area of each first pad accounting for the top wafer is less than an area of each corresponding second pad accounting for the bottom wafer.

7. The method according to claim 1, wherein a material of the insulation layer comprises one or more of the following: a silicon oxide, a silicon nitride, or a silicon oxynitride.

8. The method according to claim 1, wherein:
   the multiple pads comprise two metal elements; or
   the multiple pads comprise a metal element and a semiconductor element.

9. The method according to claim 1, wherein a micro-electro-mechanical systems (MEMS) sensor is formed in one of the top wafer or the bottom wafer.

10. A test structure manufacturing method, comprising:
    providing a top wafer structure, wherein the top wafer structure comprises a top wafer and multiple first pads that are spaced from each other at a bottom of the top wafer;
    providing a bottom wafer;
    forming a pad material layer on the bottom wafer;
    patterning the pad material layer, to form multiple second pads that are spaced from each other at a top of the bottom wafer, wherein each second pad has a trench;
    forming insulation layers on a side wall of each second pad and on a side wall of the trench; and
    bonding, in an eutectic manner, the multiple first pads with the multiple second pads, wherein each first pad is bonded with a second pad, to form multiple pads.

* * * * *